United States Patent
Yuasa

(10) Patent No.: US 9,965,025 B2
(45) Date of Patent: May 8, 2018

(54) POWER SUPPLY CONTROL APPARATUS AND COMPUTER PRODUCT

(71) Applicant: FUJITSU LIMITED, Kawasaki-shi, Kanagawa (JP)

(72) Inventor: Kentarou Yuasa, Chofu (JP)

(73) Assignee: FUJITSU LIMITED, Kawasaki (JP)

( * ) Notice: Subject to any disclaimer, the term of this patent is extended or adjusted under 35 U.S.C. 154(b) by 94 days.

(21) Appl. No.: 15/005,038

(22) Filed: Jan. 25, 2016

(65) Prior Publication Data
US 2016/0239079 A1 Aug. 18, 2016

(30) Foreign Application Priority Data

Feb. 13, 2015 (JP) .................................. 2015-026167

(51) Int. Cl.
| | | |
|---|---|---|
| G06F 1/32 | (2006.01) | |
| G06F 1/26 | (2006.01) | |
| H04L 29/08 | (2006.01) | |
| G05F 1/66 | (2006.01) | |
| H05K 7/14 | (2006.01) | |

(52) U.S. Cl.
CPC ............ G06F 1/3296 (2013.01); G06F 1/263 (2013.01); *G05F 1/66* (2013.01); *G06F 1/26* (2013.01); *G06F 1/32* (2013.01); *H04L 67/12* (2013.01); *H05K 7/1492* (2013.01)

(58) Field of Classification Search
CPC ... G05F 1/66; G06F 1/26; G06F 1/263; G06F 1/32; G06F 1/3296; G06F 1/25; H04L 67/12; H05K 7/1492
See application file for complete search history.

(56) References Cited

U.S. PATENT DOCUMENTS

| | | | | |
|---|---|---|---|---|
| 6,522,190 B1 * | 2/2003 | Malik | ....................... | H02J 1/10 307/64 |
| 7,496,772 B1 * | 2/2009 | Nguyen | ................ | G06F 1/3203 713/300 |
| 7,893,560 B2 * | 2/2011 | Carter | ....................... | H02J 1/10 307/64 |

(Continued)

FOREIGN PATENT DOCUMENTS

| | | |
|---|---|---|
| JP | 9-204240 | 8/1997 |
| JP | 10-201090 | 7/1998 |

(Continued)

*Primary Examiner* — Jaweed A Abbaszadeh
*Assistant Examiner* — Brian J Corcoran
(74) *Attorney, Agent, or Firm* — Fujitsu Patent Center

(57) ABSTRACT

A power supply control apparatus includes a control circuit configured to obtain a value of power consumed by a specified device to which plural power supply devices supply power and further configured to determine based on the obtained power value and a predetermined value obtained from power conversion efficiency of each power supply device among the plural power supply devices, a scheme of supplying power to the specified device to be any one among a first scheme in which the plural power supply devices supply power and a second scheme in which among a first power supply device and a second power supply device included in the plural power supply devices, voltage of power supplied by the first power supply device is made lower than that of power supplied by the second power supply device, whereby the second power supply device supplies power.

3 Claims, 14 Drawing Sheets

(56) References Cited

U.S. PATENT DOCUMENTS

| | | | | |
|---|---|---|---|---|
| 2004/0174149 | A1* | 9/2004 | Agari | G05F 1/565 |
| | | | | 323/271 |
| 2009/0217060 | A1 | 8/2009 | Tsuchiya | |
| 2009/0271642 | A1* | 10/2009 | Cheng | G06F 1/263 |
| | | | | 713/300 |
| 2010/0270863 | A1* | 10/2010 | Togare | H02J 1/102 |
| | | | | 307/80 |
| 2011/0066871 | A1* | 3/2011 | Farmer | G06F 1/263 |
| | | | | 713/340 |
| 2011/0310689 | A1* | 12/2011 | Hayden | G11O 5/147 |
| | | | | 365/226 |
| 2012/0066519 | A1* | 3/2012 | El-Essawy | H05K 7/1492 |
| | | | | 713/300 |

FOREIGN PATENT DOCUMENTS

| | | |
|---|---|---|
| JP | 2000-99166 | 4/2000 |
| JP | 2009-201244 | 9/2009 |

* cited by examiner

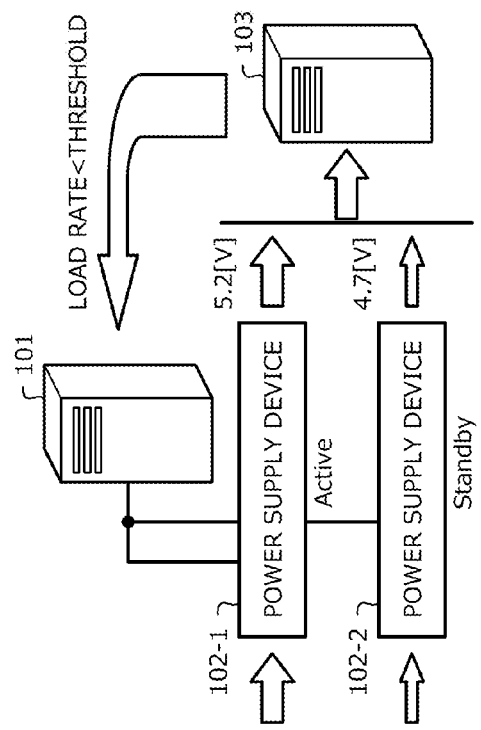
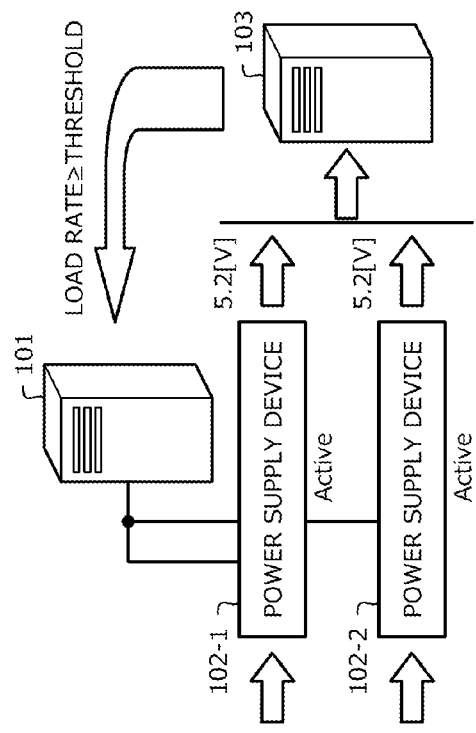

FIG.6

| INSTALLATION COUNT | FAN ROTATION SPEED | HDD OPERATION MODE | POWER INFORMATION 510 |
|---|---|---|---|
| CM | FIRST TO NINTH SPEEDS | - NORMAL MODE | xx[W] |
| CA | | | |
| HDD | | - HDD ENERGY SAVING OPERATION MODE BY MAID | |
| PSU | | | |

FIG.8

| REDUNDANT OPERATION SCHEME | Active-Active | | Active-Standby | |
|---|---|---|---|---|
| | PSU#0 | PSU#1 | PSU#0 | PSU#1 |
| INSTALLED SLOT | 5.2V | 5.2V | 5.2V | 4.7V |
| 5V OUTPUT VOLTAGE [V] | 12.2V | 12.2V | 12.2V | 11.7V |
| 12V OUTPUT VOLTAGE [V] | ENABLED | ENABLED | DISABLED | DISABLED |
| CURRENT BALANCING CIRCUIT | | | | |

| CE | IDENTIFICATION SIGNAL | | REDUNDANT OPERATION SCHEME |
|---|---|---|---|
| | Type#0 | Type#1 | |
| Model A | L | H | Active-Active |
| Model B | H | L | Active-Standby |

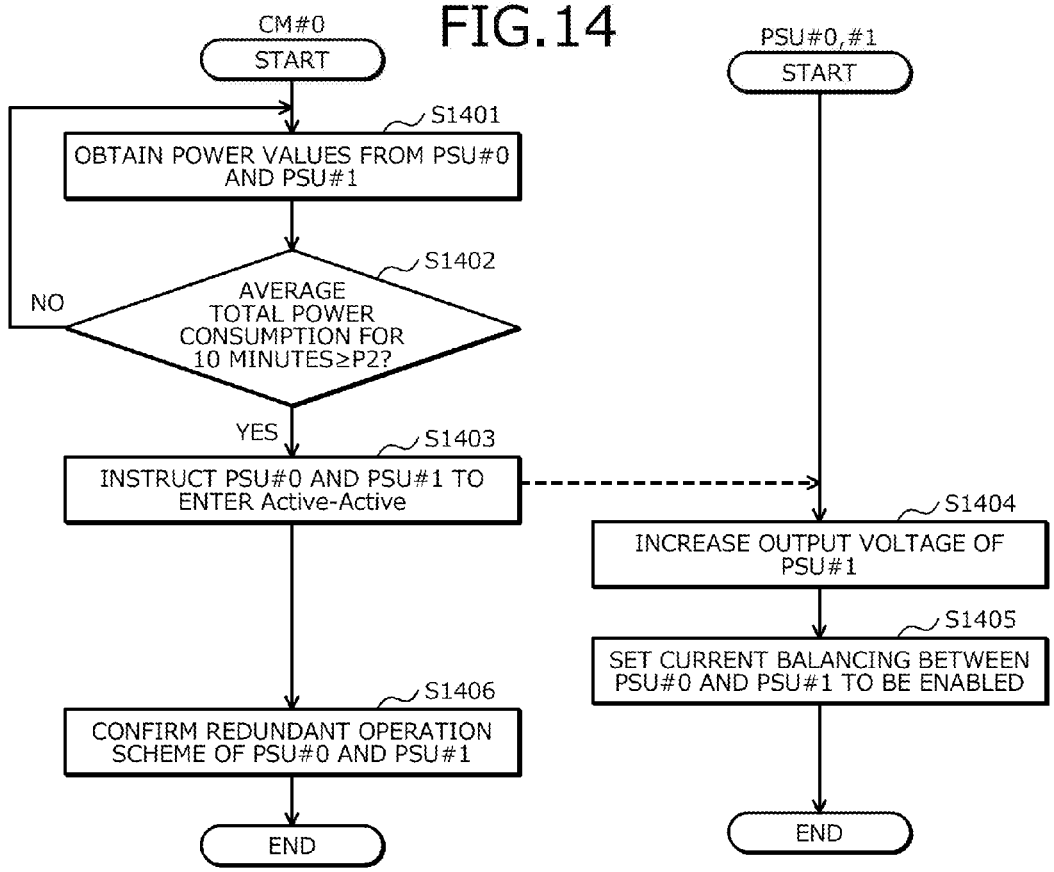

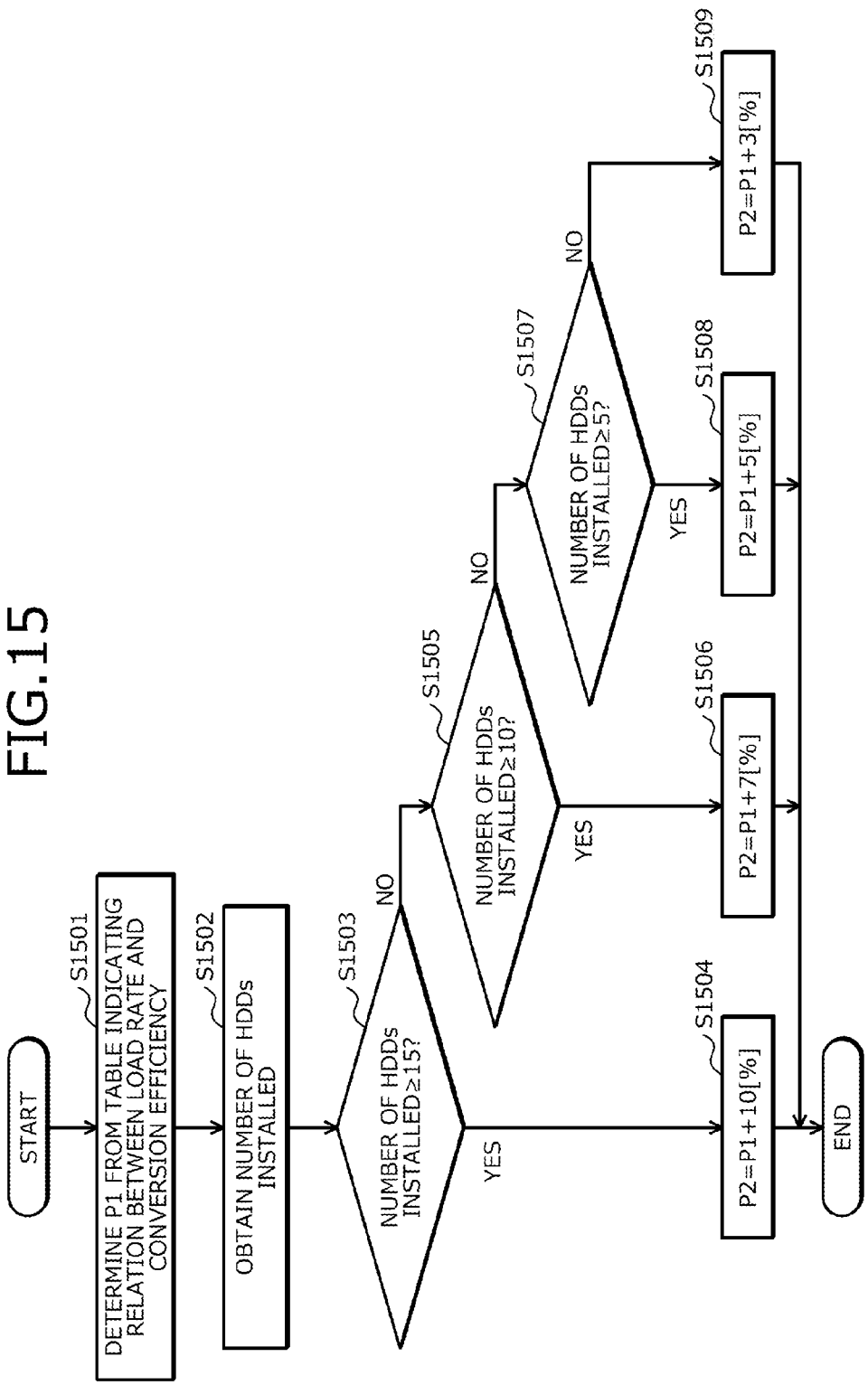

POWER SUPPLY CONTROL APPARATUS AND COMPUTER PRODUCT

CROSS REFERENCE TO RELATED APPLICATIONS

This application is based upon and claims the benefit of priority of the prior Japanese Patent Application No. 2015-026167, filed on Feb. 13, 2015, the entire contents of which are incorporated herein by reference.

FIELD

The embodiments discussed herein are related to a power supply control apparatus and computer product.

BACKGROUND

Conventionally, there are techniques of controlling plural power supply devices. According to one related technology, for example, a combination of one or more power supply units capable of supplying the amount of electrical power used by a device are extracted based on a table that indicates efficiency concerning the amount of electric power that each power supply unit can output, and the on/off of the plural power supply units is controlled. For a power supply device equipped with a power supply unit having plural power supply modules of an identical capacity, there is a technique of driving the power supply modules in a redundant state with respect to a load and turning off the power supply modules according to load conditions. There is a technology of calculating the number of plural power supply units to be operated, based on the total current value indicated by a digital signal and the rated current value of individual power supply units, and turning on/off the plural power supply units. There is a technology of supplying a same reference voltage to all power supply units connected in parallel from a power supply control unit and at the same time, adjusting the output voltage of all power supply units. For example, refer to Japanese Laid-Open Patent Document Nos. 2009-201244; H9-204240; H10-201090; and 2000-099166.

According to conventional technologies, however, it is difficult to suppress decreases in conversion efficiency while being prepared to respond quickly in case a problem occurs with any of the plural power supply devices. For example, when a power supply device among the plural power supply devices is turned off, decreases in the conversion efficiency of the power supply devices that are supplying power can be suppressed, however, when a problem occurs with a power supply device that is supplying power, it takes time to turn on a power supply device once turned off.

SUMMARY

According to an aspect of an embodiment, a power supply control apparatus includes a control circuit configured to obtain a value of power consumed by a specified device to which plural power supply devices supply power and further configured to determine based on the obtained power value and a predetermined value obtained from power conversion efficiency of each power supply device among the plural power supply devices, a scheme of supplying power to the specified device to be any one among a first scheme in which the plural power supply devices supply power and a second scheme in which among a first power supply device and a second power supply device included in the plural power supply devices, voltage of power supplied by the first power supply device is made lower than that of power supplied by the second power supply device, whereby the second power supply device supplies power.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 1A and 1B are explanatory diagrams of operation examples of a power supply control apparatus 101 according to an embodiment;

FIG. 6 is an explanatory diagram of an example of operation state information 510;

FIG. 8 is an explanatory diagram of an example of setting details of the redundant operation scheme;

FIG. 14 is a flowchart of an example of the redundant operation scheme determining process at the time of Active-Standby; and FIG. 15 is a flowchart of an example of a power threshold determining process.

DESCRIPTION OF EMBODIMENTS

Figure 2:
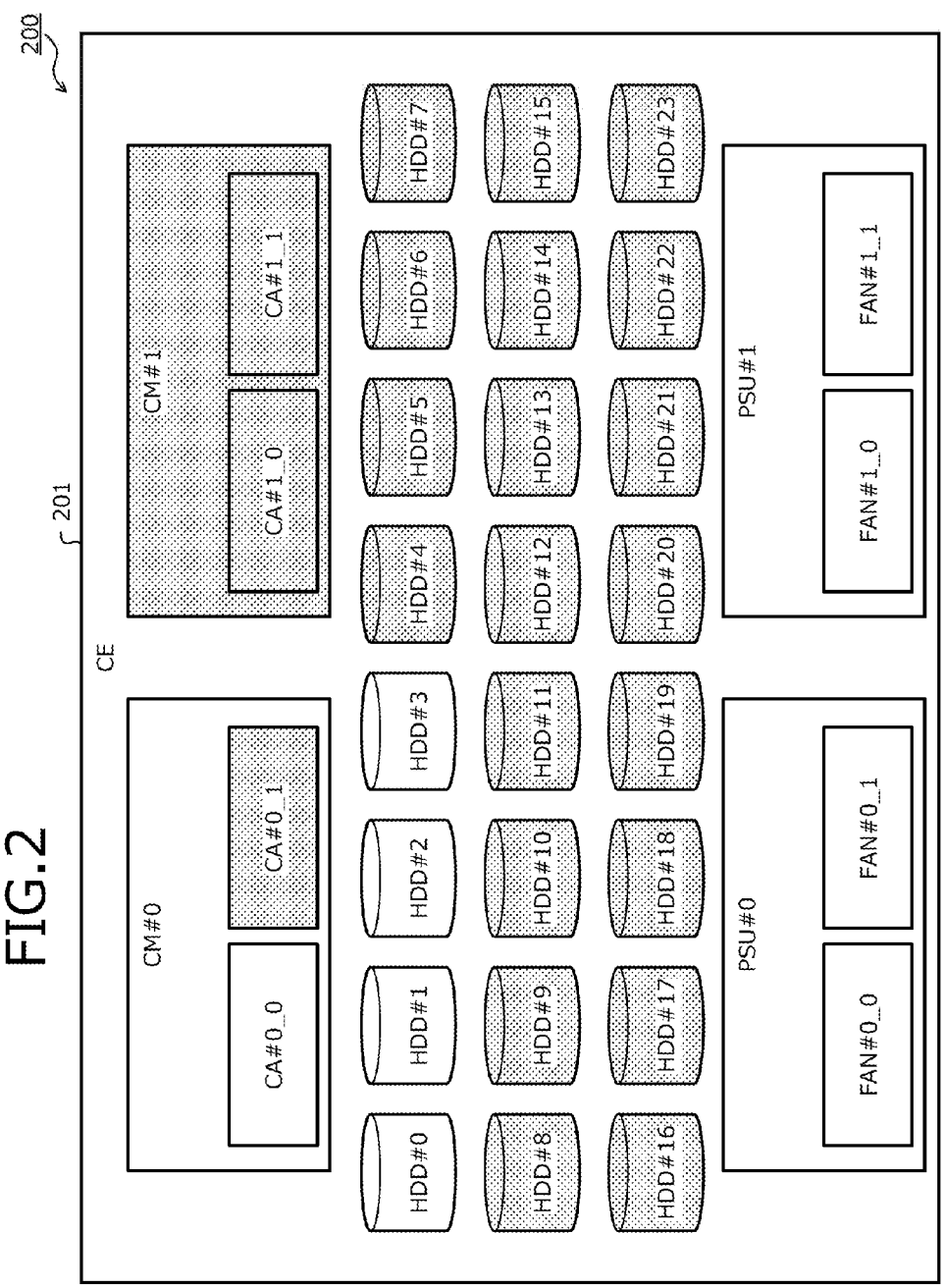
FIG. 2 is a block diagram of an example of hardware configuration of a disk array device 200.

Embodiments of a power supply control apparatus and a power supply control program of the present disclosure will be described in detail with reference to the accompanying drawings.

FIGS. 1A and 1B are explanatory diagrams of operation examples of a power supply control apparatus 101 according to an embodiment. The power supply control apparatus 101 is a computer that controls plural power supply devices 102. In the examples depicted in FIGS. 1A and 1B, the power supply control apparatus 101 controls the power supply devices 102-1 and 102-2 as the plural power supply devices 102. The power supply devices 102-1 and 102-2 supply power to a specified device 103. The specified device 103 may be any device that consumes power and for example, may be a server, a hard disk drive (HDD), etc. Alternatively, the specified device 103 may be the power supply control apparatus 101 or may include the power supply devices 102-1 and 102-2. The specified device 103 may be plural devices of various types.

The power supply devices 102-1 and 102-2 convert an alternating current to a direct current and supply the resulting power to the specified device 103. The maximum power required by the specified device 103 can be covered by one unit of the power supply device 102 and plural units of the power supply device 102-1 and 102-2 are prepared for a redundancy purpose. By making it redundant, even if either of the power supply devices 102-1, 102-2 fails, the remaining power supply device 102 can supply power to the specified device 103.

When the power supply devices 102-1 and 102-2 convert power, power loss can occur. The rate of output power to input power is given as power conversion efficiency. Hereinafter, the power conversion efficiency is occasionally referred to simply as "conversion efficiency". The conversion efficiency varies according to load rate. The load rate is a rate of the current output power to the maximum output power. A relation between the load rate and the conversion efficiency will be described in FIG. 4.

It is difficult to suppress decreases in the conversion efficiency while being prepared to respond quickly when a problem occurs with any of the power supply devices 102. For example, if a power supply device among the power supply devices 102 is turned off, decreases in the conversion efficiency of the power supply device 102 that is supplying power can be suppressed. However, when a problem occurs with the power supply device 102 that is supplying power, it takes time to turn on the power supply device 102 that has been turned off and it becomes difficult to respond quickly.

Thus, with respect to an operation scheme of the power supply devices 102-1 and 102-2, the power supply control apparatus 101 determines based on a value of the power consumed by the specified device 103 and a threshold that is a predetermined value obtained from the conversion efficiency, a first scheme or a second scheme as a scheme for supplying power to the specified device 103. For example, the power supply control apparatus 101 may determine the scheme to be the first scheme when the value of the power consumed by the specified device 103 is greater than or equal to the threshold and may determine the scheme to be the second scheme when the consumed power is less than the threshold. As a result, the power supply control apparatus 101 is able to suppress decreases in the conversion efficiency while being prepared for the occurrence of a problem with the power supply devices 102-1 and 102-2.

The power supply control apparatus 101 determined the scheme to be the first scheme or the second scheme, based on the load rate obtained by dividing the value of the power consumed by the specified device 103 by the maximum output power of the power supply device 102-1 and a predetermined threshold obtained from the relation between the load rate and the conversion efficiency. Hereinafter, description will be given with reference to an example using the load rate.

The first scheme is a scheme in which the power supply devices 102-1 and 102-2 supply power. The second scheme is a scheme in which, among the power supply devices 102-1 and 102-2, the voltage of the power supplied by a first power supply device is lowered to be below the voltage of the power supplied by a second power supply device and as a result, the second power supply device supplies the power. The power supply device 102-1 may be the first power supply device, with the power supply device 102-2 being the second power supply device or the power supply device 102-2 may be the first power supply device, with the power supply device 102-1 being the second power supply device. The threshold obtained from the conversion efficiency is a value determined by a user of the power supply control apparatus 101, taking into account the relation between the load rate and the conversion efficiency. Alternatively, configuration may be such that the user of the power supply control apparatus 101 specifies the conversion efficiency and from the relation between the load rate and the conversion efficiency, the power supply control apparatus 101 sets the value of the load rate that corresponds to the specified conversion efficiency to be the threshold. Threshold setting examples will be described with reference to FIGS. 5 and 7, etc.

In the description hereinafter, the state of the power supply device 102 when supplying power is called "Active". The state in which a power supply device 102 does not to supply power consequent to the voltage of the power supplied by the power supply device 102 being lowered to be below the voltage of the power supplied by the other power supply device 102 is called "Standby". In the following description, the first scheme is called "Active-Active". The second scheme is called "Active-Standby". The scheme of supplying power is called "redundant operation scheme".

In FIG. 1A, the power supply control apparatus 101 obtains a power consumption value of the specified device 103. The power supply control apparatus 101 calculates the load rate from the obtained power consumption value. The power supply control apparatus 101 then compares the calculated load rate and the threshold. The example in FIG. 1A assumes that the load rate is the threshold or greater, indicating a high load. In the case of a high load, the power supply control apparatus 101 determines the redundant operation scheme to be Active-Active. In the example depicted in FIG. 1A, the power supply control apparatus 101 sets the voltage of the power supply devices 102-1 and 102-2 at 5.2 [V] and performs control such that power is supplied to the specified device 103.

In FIG. 1B, the power supply control apparatus 101 obtains a power consumption value of the specified device 103. The power supply control apparatus 101 calculates the load rate from the obtained power consumption value. The power supply control apparatus 101 then compares the calculated load rate and the threshold. The example in FIG. 1B assumes that the load rate is smaller than the threshold, indicating a low load. In the case of a low load, the power supply control apparatus 101 determines the redundant operation scheme to be Active-Standby. In the example depicted in FIG. 1B, the power supply control apparatus 101 sets the voltage of the power supply device 102-2 at 4.7 [V], a voltage lower than the voltage 5.2 [V] of the power supplied by the power supply device 102-1. As a result, since the current stops flowing from the lower voltage, the power supply device 102-2 stops supplying power to the specified device 103 and the power supply device 102-1 supplies power to the specified device 103.

An example of an application of the power supply control apparatus 101 to a power supply unit (PSU) that supplies power inside a disk array device 200 will be described with reference to FIG. 2.

FIG. 2 is a block diagram of an example of hardware configuration of the disk array device 200. The disk array device 200 has a controller enclosure (CE) 201, one or more controller modules (CMs), and one or more HDDs. Further, the disk array device 200, which is based on two-scheme power receiving, has 2N units of PSUs for redundancy, where the minimum number of PSUs is N. FIG. 2 depicts an example of the disk array device 200 in the case of N=1. The disk array device 200 may have a solid state drive (SSD) in place of the HDD or may have both of the HDD and the SSD.

The disk array device 200 is a device bundling plural disk drives together. For example, the disk array device 200 is used for server data storage and can efficiently store a large volume of data, independently of the server. Recently, the volume of data handled by businesses continues to increase and to store a large volume of data after the introduction of the disk array device 200, a manager of the disk array device 200 sometimes expands the data volume of the disk array device 200 by adding the HDDs.

The CE 201 is the enclosure of the disk array device 200. The CM is a device that controls the disk array device 200. Further, the CM has one or more channel adapters (CAs). A CA is a device that connects the HDD and a host device operated by a user of the disk array device 200. The HDD is a storage device having a non-volatile storage medium. The PSU is a device that supplies power. The PSU depicted in FIG. 2 has two fans for cooling.

The disk array device 200 can expand the data capacity of the disk array device 200 by adding the HDD and the SSD. With respect to the CMs, the disk array device 200 depicted in FIG. 2 can have up to two CMs including CM#0 and CM#1 installed therein. Further, the CMs depicted in FIG. 2 can have up to two CAs installed therein. For example, the CM#0 can have up to two CAs including CA#0_0 and CA#0_1 installed therein. The CM#1 can have up to two CAs including CA#1_0 and CA#1_1 installed therein. Likewise, with respect to the HDD, the disk array device 200 depicted in FIG. 2 can have up to 24 HDDs including HDD#0 to HDD#23 installed therein.

The example depicted in FIG. 2, is an example in which there are CMs and HDDs not yet installed. In FIG. 2, a device indicated by hatching represents a device that is not yet installed. For example, in FIG. 2, CA#0_1, CM#1, and HDD#4 to HDD#23 are not yet installed.

The disk array device 200 has PSU#0 and PSU#1. The PSU#0 has FAN#0_0 and FAN0_1. The PSU#1 has FAN#1_0 and FAN#1_1. To perform redundant parallel operation, the PSU#0 and the PSU#1 have a current balancing circuit, though not depicted in FIG. 2.

When the power consumption value of the disk array device 200 reaches the maximum, all devices installable in the disk array device 200 installed are therein; the HDDs are being heavily accessed; and the fan is at the maximum rotation speed. Output rating of the PSU#0 and the PSU#1 is designed based on the maximum power consumption value of the disk array device 200. In practical use, however, when there are many devices not yet installed or when the ambient temperature of the disk array device 200 is at a suitable level, the power consumption value of the disk array device 200 is much less than the maximum power consumption value.

The CM#0 depicted in FIG. 2 corresponds to the power supply control apparatus 101 depicted in FIG. 1. The PSU#0 and the PSU#1 correspond to the power supply devices 102-1 and 102-2 depicted in FIG. 1. All devices included in the disk array device 200 depicted in FIG. 2 correspond to the specified device 103 depicted in FIG. 1. Hereinafter, description will be given using an example in which the CM#0 determines the redundant operation scheme. A hardware configuration of the CM#0 will be described with reference to FIG. 3.

Figure 3:
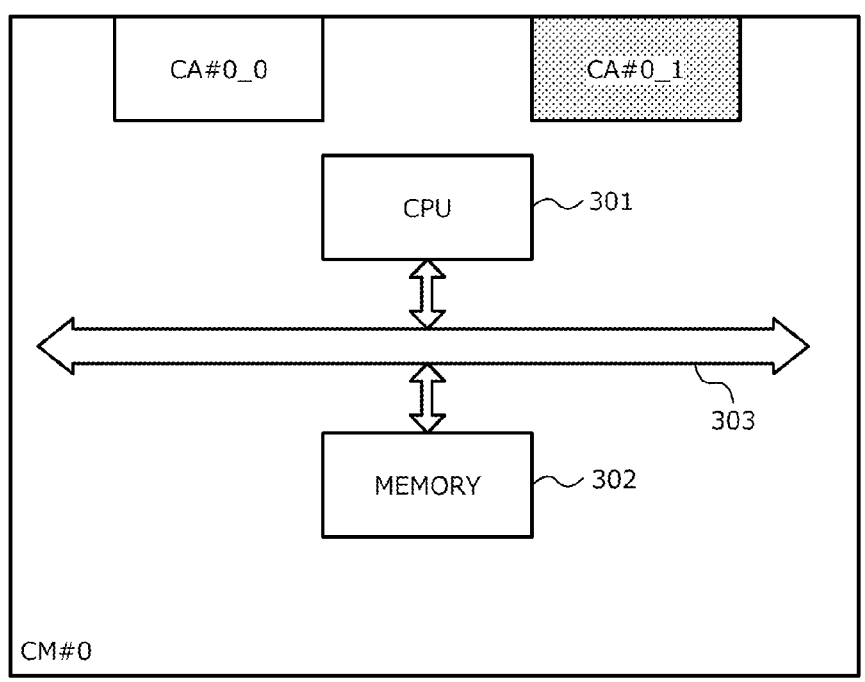
FIG. 3 is a block diagram of an example of hardware configuration of a CM#0.

FIG. 3 is a block diagram of an example of hardware configuration of the CM#0. FIG. 3 depicts an example of hardware configuration of the CM#0 depicted in FIG. 2. The CM#0 includes a central processing unit (CPU) 301, memory 302, and the CA#0_0 and the CA#0_1. The CM#0 may have plural CPUs 301. The CPU 301 and the memory 302 are connected by a bus 303. The CA#0_0 and the CA#0_1 may be connected to the bus 303 or may be connected directly to the CPU 301.

The CPU 301 is an arithmetic processing device governing overall control of the CM#0. The memory 302 includes non-volatile memory storing therein programs such as a boot program and volatile memory serving as a work area of the CPU 301.

Figure 4:
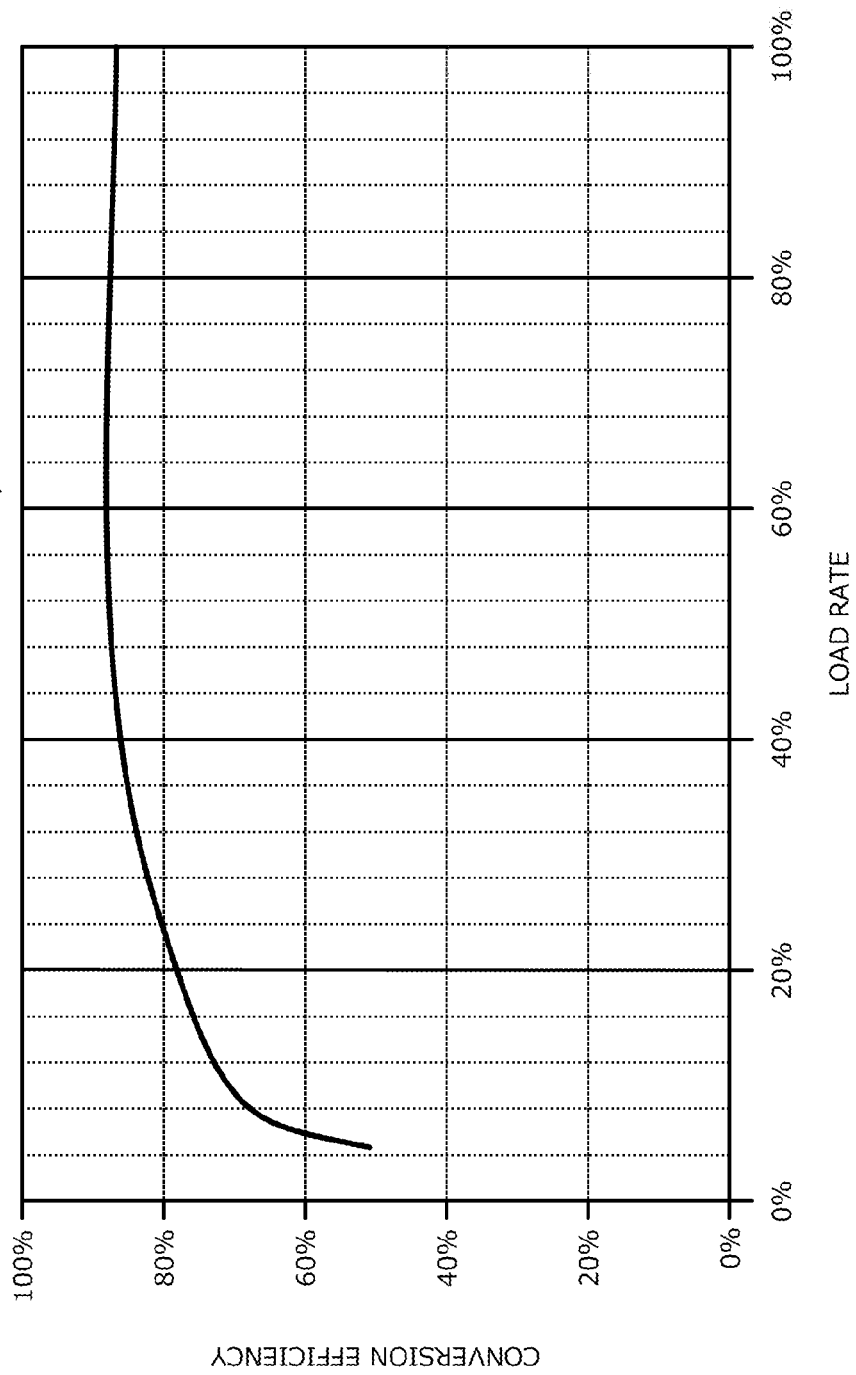
FIG. 4 is an explanatory diagram of a relation between load rate and conversion efficiency.

FIG. 4 is an explanatory diagram of a relation between the load rate and the conversion efficiency. FIG. 4 depicts a graph 401 depicting the relation between the load rate and the conversion efficiency. A horizontal axis of the graph 401 represents the load rate. A vertical axis of the graph 401 represents the conversion efficiency. As depicted by the graph 401, the PSU#0 and the PSU#1 are often designed so that the conversion efficiency is maximized at the load rate of 50 [%] and the conversion efficiency significantly decreases at low loads. At low loads, the current balancing circuit of the PSU#0 and the PSU#1 may not function or may malfunction, resulting in a biased current balance.

Figure 5:
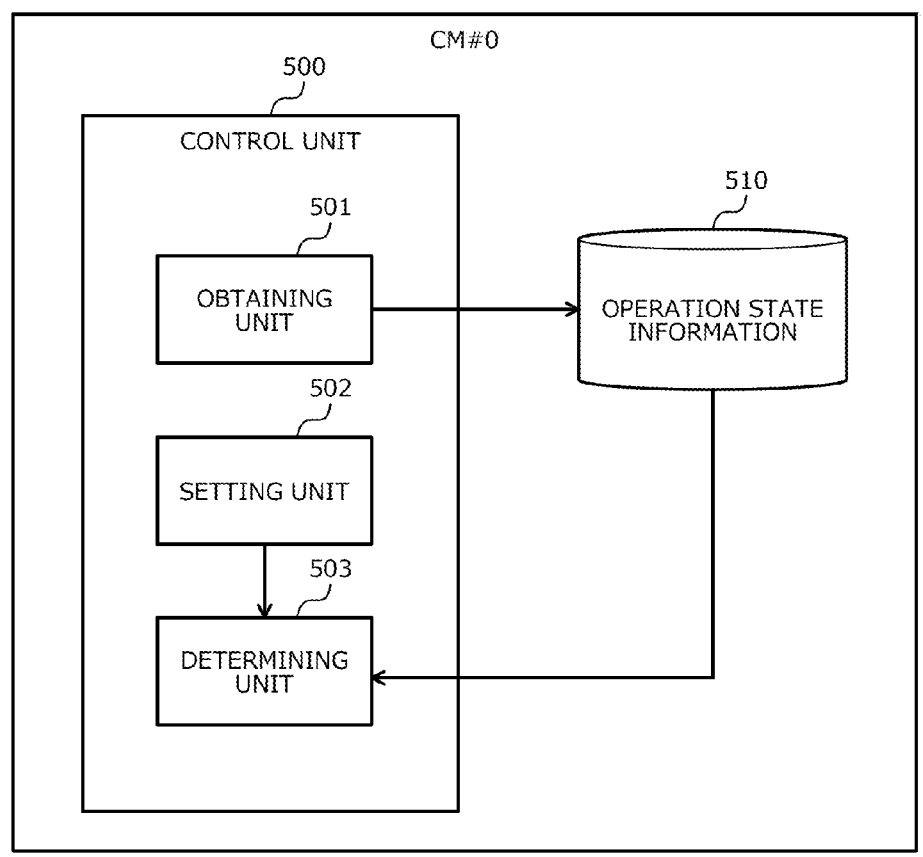
FIG. 5 is a block diagram of an example of a functional configuration of the CM#0.

FIG. 5 is a block diagram of an example of a functional configuration of the CM#0. The CM#0 includes a control unit 500. The control unit 500 includes an obtaining unit 501, a setting unit 502, and a determining unit 503. The control unit 500 realizes the function of each unit by the CPU 301 executing a program stored in a storage device. The storage device is, for example, the memory 302 depicted in FIG. 3 and the like. Results of processing by each unit are stored to a register of the CPU 301, cache memory of the CPU 301, the memory 302, etc.

The CM#0 can access operation state information 510. The operation state information 510 is stored in a storage device such as the memory 302. Details of the operation state information 510 will be described with reference to FIG. 6. The CM#0 may have access to a table indicating the relation between the load rate and the conversion efficiency depicted in FIG. 4. The table indicating the relation between the load rate and the conversion efficiency stores, for example, the conversion efficiency corresponding to the load rate.

The obtaining unit 501 obtains the value of power consumed by the devices to which the PSU#0 and the PSU#1 supply power. For example, the obtaining unit 501 obtains the power value from the PSU#0 and the PSU#1 at 10-minute intervals. The obtaining unit 501 calculates as the average total power consumption for 10 minutes, the average of total power consumption of the PSU#0 and the PSU#1 for 10 minutes and the total power consumption thereof for a past 10-minute interval. The calculated average total power consumption for 10 minutes is stored to the operation state information 510 as power information.

It is assumed that zero or more devices that access data on the disk by moving a head are installed in the disk array device 200. The device is, for example, the HDD that accesses the data on a magnetic disk by moving a magnetic head, an optical disk drive that accesses the data on an optical disk by moving an optical head, etc. The setting unit 502 refers to the following information and based on the number described above, sets a first predetermined value and a second predetermined value. The following information is information indicating the value at which Active-Standby is determined during Active-Active and the value at which Active-Active is determined during Active-Standby, according to the number described above.

As to the threshold of the load rate, the setting unit 502 may set a threshold P1 in place of the first predetermined value and a threshold P2 in place of the second predetermined value, based on the number described above. For example, if the number of HDDs installed is 15 or more, the setting unit 502 sets the threshold P1 at 50[%] and sets the threshold P2 at 60[%]. If the number of HDDs installed is 10 or more but less than 15, the setting unit 502 sets the threshold P1 at 50[%] and sets the threshold P2 at 57[%].

The determining unit 503 determines the redundant operation scheme to be Active-Active or Active-Standby, based on the load rate and the threshold. The determining unit 503 may determine the redundant operation scheme to be Active-Standby when the load rate is less than the threshold P1 while the PSU#0 and the PSU#1 are supplying power by Active-Active. The determining unit 503 may determine the redundant operation scheme to be Active-Active when the load rate is greater than or equal to the threshold P2, which is greater than the threshold P1, while the PSU#0 and the PSU#1 are supplying power by Active-Standby.

FIG. 6 is an explanatory diagram of an example of the operation state information 510. The operation state information 510 is information that indicates the operation state of the disk array device 200. The operation state information 510 includes installation counts, fan rotation speed, HDD operation modes, and power information. The installation counts are the number of units of the CM, the CA, the HDD, and the PSU installed, respectively. The fan rotation speed is the rotation speed of the FAN#0_0, the FAN#0_1, the FAN#1_0, and the FAN#1_1 and is any one of first to ninth speeds. The HDD operation mode is a normal mode or an HDD energy saving operation mode by the massive array of idle disks (MAID). The power information is the average power consumption calculated from the power consumption values obtained from the PSU#0 and the PSU#1.

Operation when the CM#0 refers to the operation state information 510 and determines the redundant operation scheme will be described with reference to FIG. 7. When the HDD operation mode is the HDD energy saving operation mode by the MAID, a motor off/on time is determined mainly by a schedule, therefore, the CM#0 can determine the redundant operation scheme of the PSU according to the MAID schedule.

Figure 7:
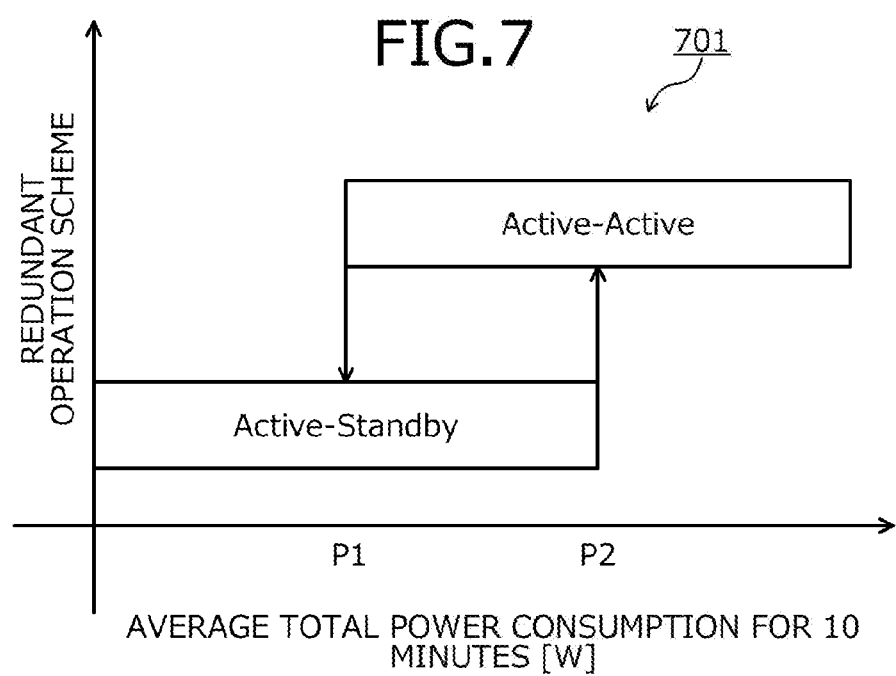
FIG. 7 is an explanatory diagram of hysteresis characteristics of the disk array device 200 and a redundant operation scheme.

FIG. 7 is an explanatory diagram of hysteresis characteristics of the disk array device 200 and the redundant operation scheme. A graph 701 depicted in FIG. 7 depicts a relation between the power consumption value and the redundant operation scheme. The horizontal axis of the graph 701 represents the average value of the total power consumption for 10 minutes. The vertical axis of the graph 701 represents Active-Active as a high value and represents Active-Standby as a low value.

The CM#0 determines the threshold P1 by referring to the table indicating the relation between the load rate and the conversion efficiency of the PSU installed in the disk array device 200. For example, the CM#0 refers to the table indicating the relation between the load rate and the conversion efficiency and detects the load rate that corresponds to the conversion efficiency of 80[%]. In the example depicted by the graph 401, the conversion efficiency becomes 80[%] when the load rate is 25[%]. Since the threshold P1 is a total of the power consumption values of the PSU#0 and the PSU#1, the CM#0 determines 50[%] as the threshold P1 by doubling the detected load rate of 25[%].

The CM#0 then determines the threshold P2 based on the determined threshold P1. A first determining method and a second determining method are given below as methods of determining the threshold P2. With respect to the first determining method, the CM#0 determines a value obtained by adding a certain load rate to the threshold P1 to be the threshold P2. For example, if the certain load rate is 10[%], the CM#0 determines P1+10=50+10=60[%] as the threshold P2. Thus, the first determining method enables hysteresis characteristics to be reflected in the thresholds P1 and P2, suppressing frequent switching of the redundant operation scheme.

With respect to the second determining method, the CM#0 determines the threshold P2 based on the operation state of the disk array device 200. An advantage of using the second determining method is that the devices installed in the disk array device 200 can include the devices for which the power consumption value differs to varying degrees. In this case, if the first determining method is employed, Active-Active and Active-Standby may be frequently switched between. For example, in the disk array device 200, an HDD may be installed that has a large fluctuation in the power consumption value as a result of the magnetic head operating consequent to disk access. On the other hand, in the disk array device 200, like the HDD, an SSD may be installed that has a small fluctuation in the power consumption value because of no driving parts are present.

Namely, when an HDD is installed in the disk array device 200, the difference between the threshold P1 and the threshold P2 should be made large and when an SSD is installed in the disk array device 200, the difference between the threshold P1 and the threshold P2 can be made small. By so doing, the CM#0 is able to shorten the time for power averaging and performing fine control and is able to operate the disk array device 200 with higher efficiency. As one example, FIG. 15 depicts an example where the CM#0 determines the threshold P2 based on the number of the HDDs installed in the disk array device 200.

FIG. 8 is an explanatory diagram of an example of setting details of the redundant operation scheme. The CM#0 sets the PSU#0 and the PSU#1 according to settings depicted in table 801, depending on whether the determined redundant operation scheme is Active-Active or Active-Standby. For example, when the determined redundant operation scheme is Active-Active, the CM#0 sets a 5V output voltage at 5.2 [V] and sets a 12V output voltage at 12.2 [V], for both the PSU#0 and the PSU#1. Further, the CM#0 sets the current balancing circuit of the PSU#0 and the PSU#1 as enabled.

On the other hand, when the determined redundant operation scheme is Active-Standby, the CM#0 sets the output voltage of the PSU#1 so that both the 5V output voltage and the 12V output voltage will be 0.5 [V] lower, as compared with the setting in the case of Active-Active. Further, the CM#0 sets the current balancing circuit of the PSU#0 and the PSU#1 as disabled.

While an example of dynamically switching the redundant operation scheme of the PSU is depicted in FIGS. 6 to 8, the redundant operation scheme may be switched by adding an identification signal to the CE. Namely, the redundant operation scheme of the PSU may be switched by adding a CE identification signal to the MidPlane of the CE. An example of the CE identification signal is described using FIG. 9.

Figures 9, 10:
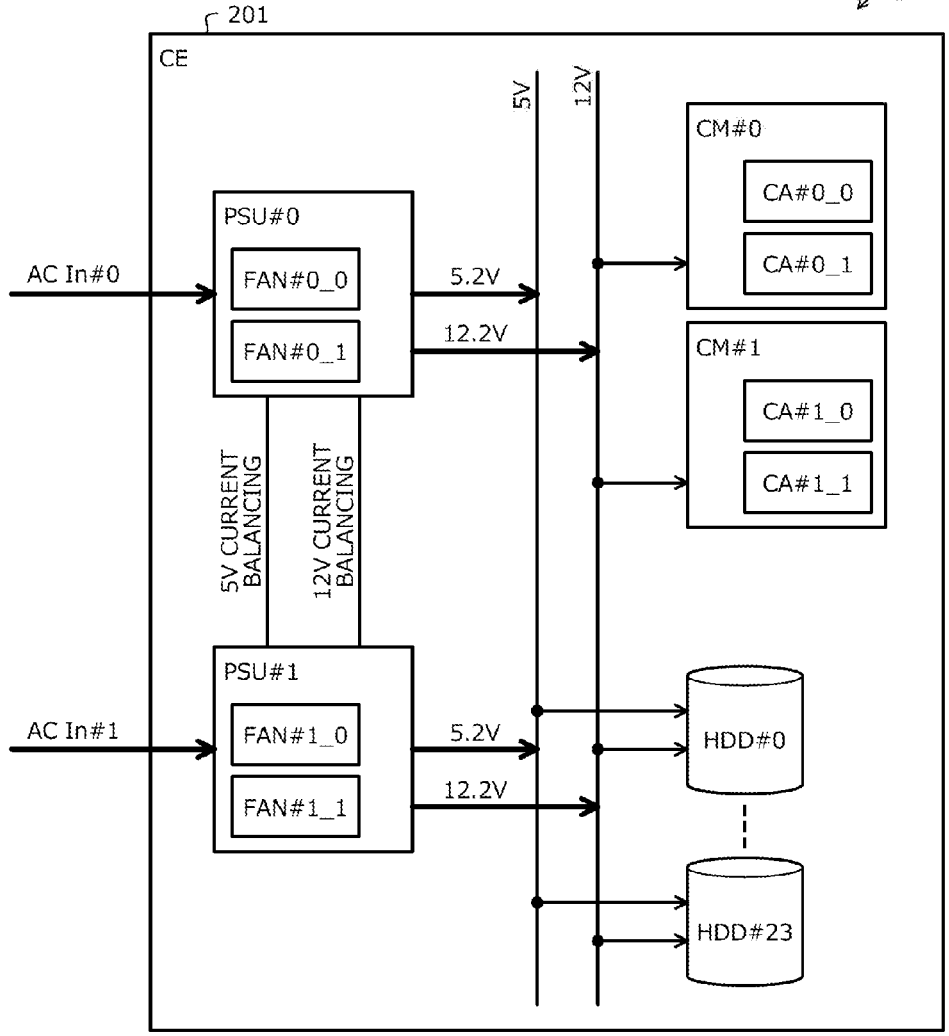
FIG. 9 is an explanatory diagram of an example of a CE identification signal.
FIG. 10 is an explanatory diagram of an example of a power supply scheme in Active-Active.

FIG. 9 is an explanatory diagram of an example of a CE identification signal. Table 901 depicted in FIG. 9 depicts example of the identification signal for setting the redundant operation scheme to Active-Active and the identification signal for setting the redundant operation scheme to Active-Standby. For example, Model A, which sets the redundant operation scheme to Active-Active, has an identification signal with Type#0 set to L and Type#1 set to H. Model B, which sets the redundant operation scheme to Active-Standby, has an identification signal with Type#0 set to H and Type#1 set to L. By setting Model A or Model B in the CE, the CM of the disk array device 200 having the set CE fixes the redundant operation scheme to either Active-Active or Active-Standby.

In the example of dynamically switching the redundant operation scheme of the PSU depicted in FIGS. 6 to 8 and the example of adding the CE identification signal, in the case of Active-Standby, a difference in a usable period due to generation of heat can occur between an Active PSU and a Standby PSU. Accordingly, the CM#0 may periodically switch the PSU that serves as Standby and the PSU that serves as Active at the time of Active-Standby.

An example of a power supply scheme for Active-Active and Active-Standby will be given, using FIGS. 10 and 11.

FIG. 10 is an explanatory diagram of an example of the power supply scheme in Active-Active. The disk array device 200 depicted in FIG. 10 is in a state of having all devices installable in the disk array device 200 installed therein. The PSU#0 and the PSU#1 receive power from alternating-current (AC) AC In#0 and AC In#1, respectively. In the disk array device 200 depicted in FIG. 10, the PSU#0 and the PSU#1 supply power to the CM#0, the CM#1, and the HDD#0 to the HDD#23, respectively.

Figure 11:
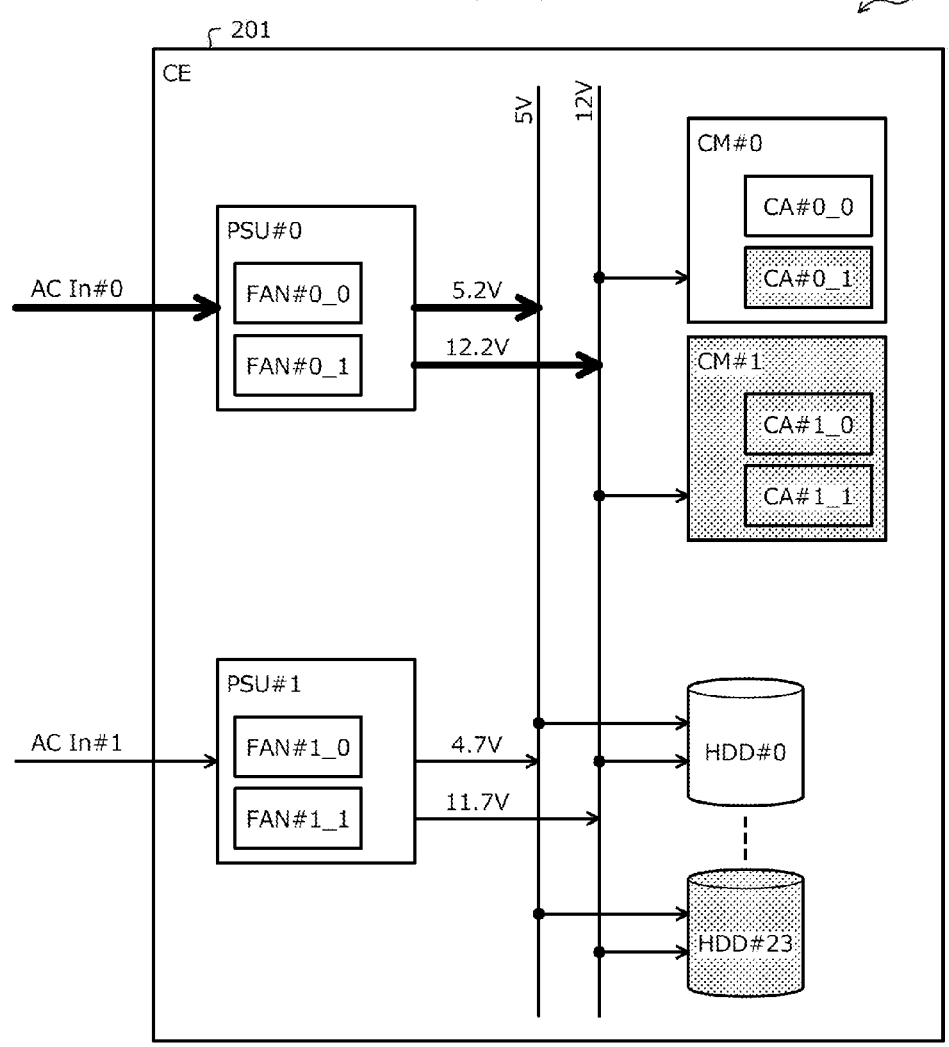
FIG. 11 is an explanatory diagram of an example of the power supply scheme in Active-Standby.

FIG. 11 is an explanatory diagram of an example of the power supply scheme in Active-Standby. The disk array device 200 depicted in FIG. 11, like the disk array device 200 depicted in FIG. 2, has the CA#0_1, the CM#1, and the HDD#4 to the HDD#23 not yet installed therein. The PSU#0 and the PSU#1 receive power from alternating-current AC In#0 and AC In#1, respectively.

In the disk array device 200 depicted in FIG. 11, the PSU#0 supplies power to the CM#0 and the HDD#0 to the HDD#3, respectively. Since the PSU#1 is set at a voltage lower than that of the PSU#0, no current flows from the PSU#1. Therefore, the PSU#1 does not supply power to any among the CM#0 and the HDD#0 to the HDD#3. In the disk array device 200 depicted in FIG. 11, the AC In#0 becomes large as compared with the AC In#1.

The conversion efficiency will be described of the PSU#0 and the PSU#1 in Active-Active and Active-Standby, in two patterns, with reference to FIGS. 10 and 11. In pattern 1, it is assumed that the load rate of the disk array device 200 as a whole is 80[%] of the rated output of the PSU#0 and the PSU#1. In pattern 2, it is assumed that the load rate of the disk array device 200 as a whole is 30[%] of the rated output of the PSU#0 and the PSU#1.

In the case of the Active-Active operation in pattern 1, the PSU#0 and the PSU#1 have the same setting of the output voltages and have the current balancing circuit enabled and the rate of load on the PSU#0 and the PSU#1 is 40[%]. According to the graph 401, the conversion efficiency of the PSU#0 and the PSU#1 is 87[%], enabling the PSU#0 and the PSU#1 to be operated with high efficiency. The case of operating the PSU#0 and the PSU#1 by Active-Active in pattern 1 corresponds to the state depicted in FIG. 10.

In the case of the operation by Active-Standby in pattern 1, since the output voltage setting differs between the PSU#0 and the PSU#1 and the current balancing circuit is disabled, the rate of load on the PSU#0 is 80[%] and the rate of load on the PSU#1 is 0[%]. In this case, values of the currents flowing to the AC In#0 and the AC In#1 widely differ. According to the graph 401, the conversion efficiency of the PSU#0 is 88[%] and the PSU#0 can be operated with high efficiency. In this case, however, since a current close to the rated output continues to flow, the usable period of the PSU#0 is shortened.

In the case of the operation by Active-Active in pattern 2, the PSU#0 and the PSU#1 have the same setting of output voltages and have the current balancing circuit enabled and the rate of load on the PSU#0 and the PSU#1 is 15[%]. According to the graph 401, the conversion efficiency of the PSU#0 and the PSU#1 is 70[%] and the PSU#0 and the PSU#1 are operated with large loss. Because of the small load rate, it is possible that the current balancing circuit cannot operate normally.

In the case of the operation by Active-Standby in pattern 2, since the output voltage setting differs between the PSU#0 and the PSU#1 and the current balancing circuit is disabled, the rate of load on the PSU#0 is 30[%] and the rate of load on the PSU#1 is 0[%]. According to the graph 401, the conversion efficiency of the PSU#0 is 84[%] and the PSU#0 can be operated with high efficiency. The case of operating the PSU#0 and the PSU#1 by Active-Standby in pattern 2 corresponds to the state depicted in FIG. 11.

A flowchart of processing executed by the disk array device 200 will be described with reference to FIGS. 12 to 15.

Figure 12:
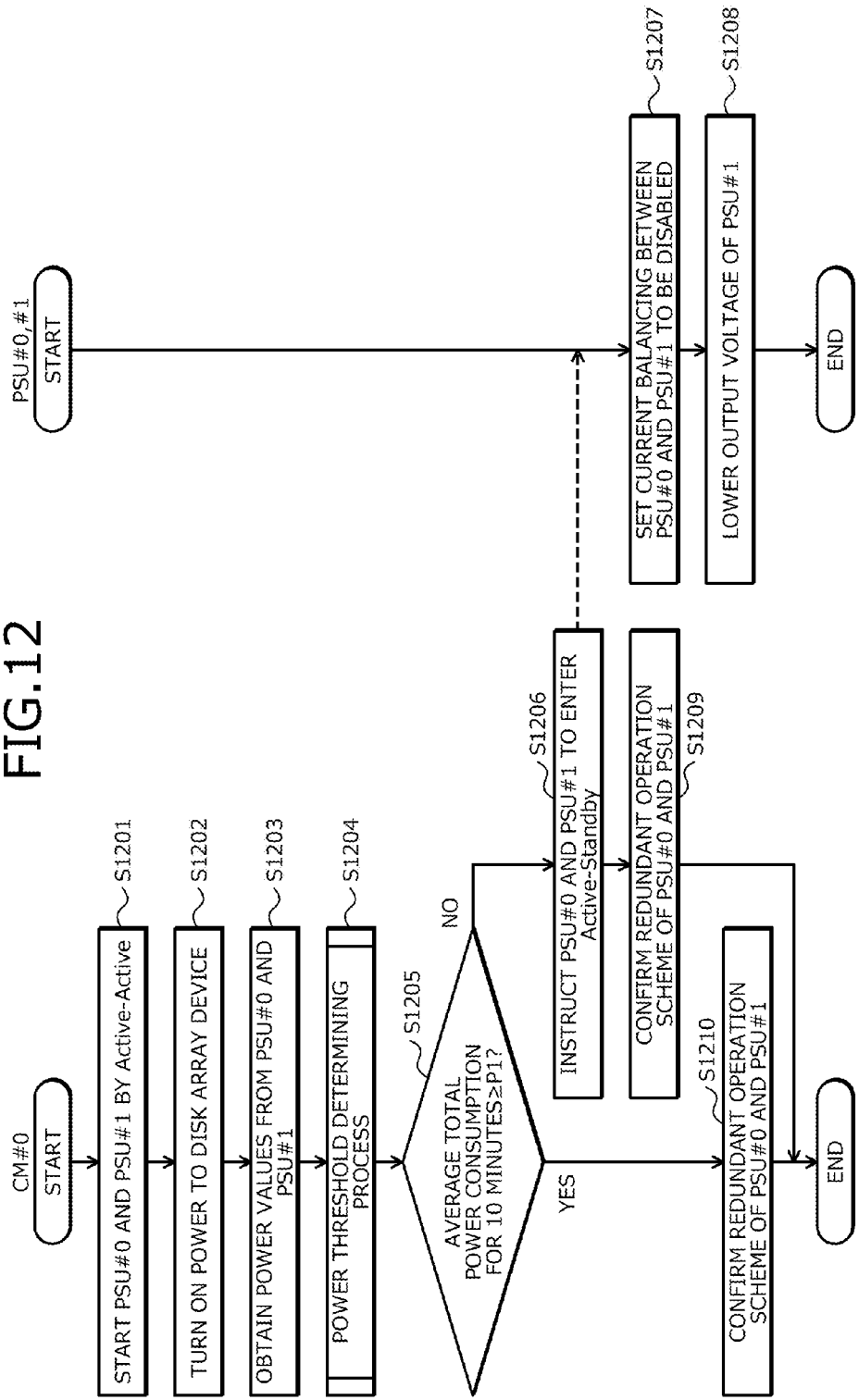
FIG. 12 is a flowchart of an example of a redundant operation scheme determining process at startup.

FIG. 12 is a flowchart of an example of a redundant operation scheme determining process at startup. The redundant operation scheme determining process at startup is processing of determining the redundant operation scheme of the PSU#0 and the PSU#1 at the time of startup of the disk array device 200. Execution of the redundant operation scheme determining process at startup is triggered by AC "ON" of the disk array device 200. The redundant operation scheme determining process at startup is processing executed by a cooperation of the CM and the PSU#0 and the PSU#1. The CM that executes the redundant operation scheme determining process at startup may be any CM that is installed in the disk array device 200. In FIG. 12, description will be given using an example of execution by the CM#0.

The CM#0 starts the PSU#0 and the PSU#1 by Active-Active (step S1201). The CM#0 turns on power to the disk array device 200 (step S1202). The CM#0 obtains power values from the PSU#0 and the PSU#1 (step S1203).

The CM#0 executes a power threshold determining process (step S1204). Details of the power threshold determining process will be described with reference to FIG. 15. The CM#0 determines if the average total power consumption for 10 minutes is greater than or equal to P1 (step S1205). If the average total power consumption for 10 minutes is less than P1 (step S1205: NO), then the CM#0 instructs the PSU#0 and the PSU#1 to enter Active-Standby (step S1206).

The PSU#0 and the PSU#1 instructed to enter Active-Standby set the current balancing between the PSU#0 and the PSU#1 to be disabled (step S1207). The PSU#1 lowers the output voltage of the PSU#1 (step S1208). After completion of the operation at step S1208, the PSU#0 and the PSU#1 end the redundant operation scheme determining process at startup.

Meanwhile, the CM#0 that instructed the PSU#0 and the PSU#1 confirms the redundant operation scheme of the PSU#0 and the PSU#1 (step S1209). By the operation at step S1209, the redundant operation scheme of the PSU#0 and the PSU#1 is switched to Active-Standby.

If the average total power consumption for 10 minutes is greater than or equal to P1 (step S1205: YES), the CM#0 confirms the redundant operation scheme of the PSU#0 and the PSU#1 (step S1210). By the operation at step S1210, the redundant operation scheme of the PSU#0 and the PSU#1 becomes Active-Active.

After completion of the operation at step S1209 or step 1210, the CM#0 ends the redundant operation scheme determining process at startup. By the execution of the redundant operation scheme determining process at startup, the CM#0 can determine a suitable redundant operation scheme for the PSU#0 and the PSU#1 at the time of startup of the disk array device 200.

Figure 13:
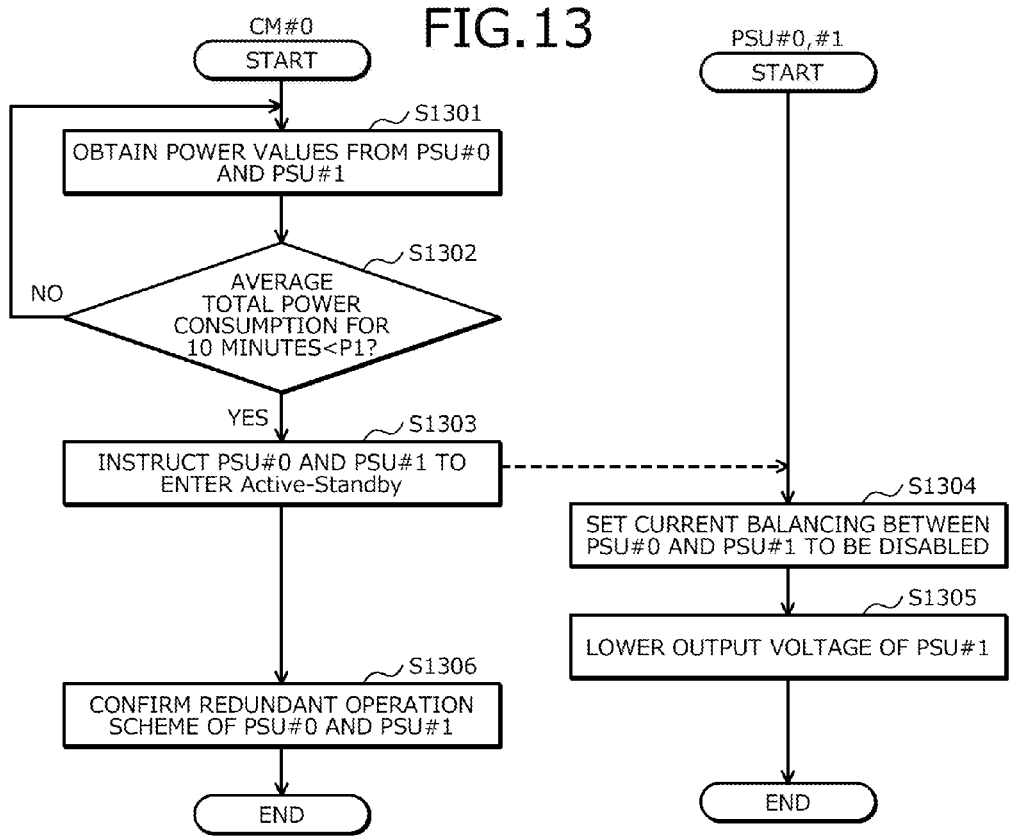
FIG. 13 is a flowchart of an example of the redundant operation scheme determining process at the time of Active-Active.

FIG. 13 is a flowchart of an example of the redundant operation scheme determining process at the time of Active-Active. The redundant operation scheme determining process at the time of Active-Active is processing of determining the redundant operation scheme when the redundant operation scheme of the PSU#0 and the PSU#1 is Active-Active. The redundant operation scheme determining process at the time of Active-Active is processing executed by a cooperation of the CM and the PSU#0 and the PSU#1. The CM that executes the redundant operation scheme determining process at the time of Active-Active may be any CM that is installed in the disk array device 200. In FIG. 13, description will be given using an example of execution by the CM#0.

The CM#0 obtains power values from the PSU#0 and the PSU#1 (step S1301). The CM#0 determines whether the average value total power consumption for 10 minutes is less than P1 (step S1302). If the average value of the total power consumption for 10 minutes is greater than or equal to P1 (step S1302: NO), the CM#0 executes the operation at step S1301 after 10 minutes elapse.

On the other hand, if the average total power consumption for 10 minutes is less than P1 (step S1302: YES), the CM#0 instructs the PSU#0 and the PSU#1 to enter Active-Standby (step 1303).

The PSU#0 and the PSU#1 instructed to enter Active-Standby set the current balancing between the PSU#0 and the PSU#1 to be disabled (step S1304). The PSU#1 lowers the output voltage of the PSU#1 (step S1305). After completion of the operation at step S1305, the PSU#0 and the PSU#1 end the redundant operation scheme determining process at the time of Active-Active.

Meanwhile, the CM#0 that instructed the PSU#0 and the PSU#1 confirms the redundant operation scheme of the PSU#0 and the PSU#1 (step S1306). By the operation at step S1306, the redundant operation scheme of the PSU#0 and the PSU#1 is switched to Active-Standby.

After completion of the processing of step S1306, the CM#0 ends the redundant operation scheme determining process at the time of Active-Active. By the execution of the redundant operation scheme determining process at the time of Active-Active, the CM#0 can switch the redundant operation scheme of the PSU#0 and the PSU#1 to Active-Standby when the power consumption of the disk array device 200 decreases.

FIG. 14 is a flowchart of an example of the redundant operation scheme determining process at the time of Active-Standby. The redundant operation scheme determining process at the time of Active-Standby is processing of determining the redundant operation scheme when the redundant operation scheme of the PSU#0 and the PSU#1 is Active-Standby. The redundant operation scheme determining process at the time of Active-Standby is processing executed by a cooperation of the CM and the PSU#0 and the PSU#1. The CM that executes the redundant operation scheme determining process at the time of Active-Standby may be any CM that is installed in the disk array device 200. In FIG. 14, description will be given using an example of execution by the CM#0.

The CM#0 obtains power values from the PSU#0 and the PSU#1 (step S1401). The CM#0 determines if the average total power consumption for 10 minutes is greater than or equal to P2 (step S1402). If the average total power consumption for 10 minutes is less than P2 (step S1402: NO), then the CM#0 executes the operation at step S1401 after 10 minutes elapse.

On the other hand, if the average total power consumption for 10 minutes is greater than or equal to P2 (step S1402: YES), the CM#0 instructs the PSU#0 and the PSU#1 to enter Active-Active to (step 1403).

The PSU#1 instructed to be Active-Active increases the output voltage of the PSU#1 (step S1404). The PSU#0 and PSU#1 set the current balancing between the PSU#0 and the PSU#1 to be enabled (step S1405). After completion of the operation at step S1405, the PSU#0 and the PSU#1 end the redundant operation scheme determining process at the time of Active-Standby.

Meanwhile, the CM#0 that instructed the PSU#0 and the PSU#1 confirms the redundant operation scheme of the PSU#0 and the PSU#1 (step S1406). By the operation at step S1406, the redundant operation scheme of the PSU#0 and the PSU#1 is switched to Active-Active.

After completion of the processing of step S1406, the CM#0 ends the redundant operation scheme determining process at the time of Active-Standby. By the execution of the redundant operation scheme determining process at the time of Active-Standby, the CM#0 can switch the redundant operation scheme of the PSU#0 and the PSU#1 to Active-Active when the power consumption of the disk array device 200 increases.

FIG. 15 is a flowchart of an example of the power threshold determining process. The power threshold determining process is processing of determining the power thresholds P1 and P2.

The CM#0 determines P1 from the table indicating the relation between the load rate and the conversion efficiency (step S1501). The CM#0 refers to the operation state information 510 and obtains the number of HDDs installed (step S1502).

The CM#0 determines if the number of HDDs installed is greater than or equal to 15 (step S1503). If the number of HDDs installed is greater than or equal to 15 (step S1503: YES), the CM#0 sets P2 to be P1+10 [%] (step S1504).

On the other hand, if the number of HDDs installed is less than 15 (step S1503: NO), then the CM#0 determines if the number of HDDs installed is greater than or equal to 10 (step S1505). If the number of HDDs installed is greater than or equal to 10 (step S1505: YES), then the CM#0 sets P2 to be P1+7 [%] (step S1506).

On the other hand, if the number of HDDs installed is less than 10 (step S1505: NO), the CM#0 determines if the number of HDDs installed is greater than or equal to 5 (step S1507). If the number of HDDs installed is greater than or equal to 5 (step S1507: YES), then the CM#0 sets P2 to be P1+5 [%] (step S1508). On the other hand, if the number of HDDs installed is less than 5 (step S1507: NO), then the CM#0 sets P2 to be P1+3 [%] (step S1509).

After completion of the operation any of steps S1504, S1506, S1508, and S1509, the CM#0 ends the power threshold determining process. By executing the power threshold determining process, the CM#0 can determine, as the power threshold P1 and P2, the values corresponding to the degree of variation of the power consumption of the devices installed in the disk array device 200.

As described, according to the CM#0, the redundant operation scheme is determined to be Active-Active or Active-Standby, based on the thresholds obtained from the power consumption value and the conversion efficiency of the devices installed in the disk array device 200. This enables the CM#0 to suppress decreases in the conversion efficiency while enabling the CM#0 to be prepared for an occurrence of trouble with the PSU#0 or the PSU#1. By suppressing drops in the conversion efficiency, the CM#0 can suppress power loss.

According to the CM#0, when the load rate is smaller than the threshold P1 when the redundant operation scheme is Active-Active, the redundant operation scheme may be determined to be Active-Standby. According to the CM#0, when the load rate is greater than or equal to the threshold P2 when the redundant operation scheme is Active-Standby, the redundant operation scheme may be determined to be Active-Active. Thus, by reflecting hysteresis characteristics on the thresholds P1 and P2, the CM#0 can suppress frequent switching of the redundant operation scheme.

According to the CM#0, the thresholds P1 and P2 may be determined according to the number of the devices that access data on a disk by moving the head, such as the HDDs. As a result, when there are a large number of devices having a large degree of variation, the CM#0 makes the difference between the thresholds P1 and P2 large, enabling frequent switching of the redundant operation scheme to be suppressed. When there are a small number of devices having a large degree of variation, the CM#0 makes the difference between the thresholds P1 and P2 small, enabling the time for power averaging and the fine control to be shortened and the disk array device 200 to be operated with higher efficiency.

The power supply control method described in the embodiment can be realized by executing a prepared program on a computer such as a personal computer and a workstation. This power supply control program is recorded on a non-transitory, computer-readable recording medium such as a hard disk, a flexible disk, a compact disk-read only memory (CD-ROM), and a digital versatile disk (DVD) and is executed by being read out by the computer from the recording medium. This power supply control program may be distributed by way of a network such as Internet.

According to one aspect of the present disclosure, an effect is achieved in that plural power supply devices can be used efficiently.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A power supply control apparatus comprising:
   a control circuit configured to obtain a value of power consumed by a specified device to which a plurality of power supply devices supply power and further configured to determine based on the obtained power value and a predetermined value obtained from power conversion efficiency of each power supply device among the plurality of power supply devices, a scheme of supplying power to the specified device to be any one among a first scheme in which the plurality of power supply devices supply power and a second scheme in which among a first power supply device and a second power supply device included in the plurality of power supply devices, voltage of power supplied by the first power supply device is lowered to a voltage that is greater than 0 and lower than a voltage of power supplied by the second power supply device, whereby the second power supply device supplies power, the control circuit
      determines the scheme of supplying power to the specified device to be the second scheme when the obtained power value is smaller than a first predetermined value obtained from the conversion efficiency, while power is being supplied to the specified device by the first scheme, and
      determines the scheme of supplying power to the specified device to be the first scheme when the obtained power value is greater than or equal to a second predetermined value that is greater than the first predetermined value, while power is being supplied to the specified device by the second scheme,
   the specified device is a device that accesses data on a disk by moving a head, and
   the control circuit sets the first predetermined value and the second predetermined value such that the greater a count of the specified device is, the greater a difference between the first predetermined value and the second predetermined value becomes.

2. A non-transitory, computer-readable recording medium storing therein a power supply control program causing a computer to execute a process comprising:
   obtaining a value of power consumed by a specified device to which a plurality of power supply devices supply power; and
   determining, based on the obtained power value and a predetermined value obtained from power conversion efficiency of each power supply device among the plurality of power supply devices, a scheme of supplying power to the specified device to be any one among a first scheme in which the plurality of power supply devices supply power and a second scheme in which among a first power supply device and a second power supply device included in the plurality of power supply devices, voltage of power supplied by the first power supply device is lowered to a voltage that is greater than 0 and lower than a voltage of power supplied by the second power supply device, whereby the second power supply device supplies power, the determining includes
      determining the scheme of supplying power to the specified device to be the second scheme when the obtained power value is smaller than a first predetermined value obtained from the conversion efficiency, while power is being supplied to the specified device by the first scheme, and
      determining the scheme of supplying power to the specified device to be the first scheme when the obtained power value is greater than or equal to a second predetermined value that is greater than the first predetermined value, while power is being supplied to the specified device by the second scheme, the specified device is a device that accesses data on a disk by moving a head, and the process further comprises setting the first predetermined value and the second predetermined value such that the greater a count of the specified device is, the greater a difference between the first predetermined value and the second predetermined value becomes.

3. A power supply control method comprising:

obtaining by a computer, a value of power consumed by a specified device to which a plurality of power supply devices supply power; and determining by the computer, based on the obtained power value and a predetermined value obtained from power conversion efficiency of each power supply device among the plurality of power supply devices, a scheme of supplying power to the specified device to be any one among a first scheme in which the plurality of power supply devices supply power and a second scheme in which among a first power supply device and a second power supply device included in the plurality of power supply devices, voltage of power supplied by the first power supply device is lowered to a voltage that is greater than 0 and lower than a voltage of power supplied by the second power supply device, whereby the second power supply device supplies power, the determining includes determining the scheme of supplying power to the specified device to be the second scheme when the obtained power value is smaller than a first predetermined value obtained from the conversion efficiency, while power is being supplied to the specified device by the first scheme, and determining the scheme of supplying power to the specified device to be the first scheme when the obtained power value is greater than or equal to a second predetermined value that is greater than the first predetermined value, while power is being supplied to the specified device by the second scheme, the specified device is a device that accesses data on a disk by moving a head, and the power supply control method further comprises setting by the computer, the first predetermined value and the second predetermined value such that the greater a count of the specified device is, the greater a difference between the first predetermined value and the second predetermined value becomes.

* * * * *